United States Patent
Xia

(10) Patent No.: US 9,111,903 B2
(45) Date of Patent: Aug. 18, 2015

(54) HEAT DISSIPATION DEVICE WITH FASTENER

(75) Inventor: Ben-Fan Xia, KunShan (CN)

(73) Assignees: FURUI PRECISE COMPONENT (KUNSHAN) CO., LTD., Kunshan (CN); Foxconn Technology Co., Ltd., New Taipei (TW)

(*) Notice: Subject to any disclaimer, the term of this patent is extended or adjusted under 35 U.S.C. 154(b) by 478 days.

(21) Appl. No.: 13/564,743

(22) Filed: Aug. 2, 2012

(65) Prior Publication Data

US 2014/0000855 A1    Jan. 2, 2014

(30) Foreign Application Priority Data

Jun. 27, 2012    (CN) .......................... 2012 1 0215050

(51) Int. Cl.
     *F16B 21/08*      (2006.01)
     *H01L 23/40*      (2006.01)

(52) U.S. Cl.
     CPC ...... *H01L 23/4006* (2013.01); *H01L 2023/4062* (2013.01); *H01L 2023/4081* (2013.01); *H01L 2924/0002* (2013.01)

(58) Field of Classification Search
     CPC ................................. F16B 21/08; F16B 21/09
     USPC .................. 411/352, 353, 356, 360, 364, 469
     See application file for complete search history.

(56) References Cited

U.S. PATENT DOCUMENTS

| | | | | |
|---|---|---|---|---|
| 3,934,315 | A * | 1/1976 | Millheiser et al. | 24/453 |
| 6,786,691 | B2 * | 9/2004 | Alden, III | 411/371.2 |
| 6,859,368 | B2 * | 2/2005 | Yang | 361/704 |
| 7,359,200 | B2 * | 4/2008 | Zhou et al. | 361/704 |
| 2003/0175091 | A1 * | 9/2003 | Aukzemas et al. | 411/107 |
| 2006/0232944 | A1 * | 10/2006 | Zhang et al. | 361/719 |
| 2008/0056844 | A1 * | 3/2008 | Aukzemas et al. | 411/353 |
| 2008/0273942 | A1 * | 11/2008 | Lin | 411/432 |
| 2009/0110511 | A1 * | 4/2009 | Cheng | 411/349 |
| 2009/0202319 | A1 * | 8/2009 | Wang et al. | 411/353 |
| 2009/0283243 | A1 * | 11/2009 | Zha | 165/80.3 |
| 2009/0296347 | A1 * | 12/2009 | Kuo et al. | 361/696 |
| 2010/0142152 | A1 * | 6/2010 | Li et al. | 361/710 |

* cited by examiner

*Primary Examiner* — Roberta Delisle
(74) *Attorney, Agent, or Firm* — Novak Druce Connolly Bove + Quigg LLP

(57) ABSTRACT

A heat dissipation device includes a conductive plate and a fastener. The fastener includes a fastening element and an elastic element coiled around the fastening element. The fastening element includes a pole portion and a head portion formed at one end of the pole portion. The conductive plate defines a supporting portion through the conductive plate. The supporting portion defines a hole, an upper groove and a lower groove communicating with one another. The upper groove and the lower groove are coaxial with each other. A flange protrudes from a circumference of the pole portion. The pole portion enters the upper groove. The flange abuts a bottom of the conductive plate and is received in the lower groove. The elastic element elastically abuts the top of the conductive plate.

16 Claims, 9 Drawing Sheets

HEAT DISSIPATION DEVICE WITH FASTENER

BACKGROUND

1. Technical Field

The disclosure relates to heat dissipation devices and, more particularly, to a heat dissipation device with a fastener for fastening the heat dissipation device on a printed circuit board.

2. Description of Related Art

It is well known that, during operation of a computer, electronic devices such as central processing units (CPUs) frequently generate large amounts of heat. The heat must be quickly removed from the electronic device to prevent it from becoming unstable or being damaged. Typically, a heat sink is attached to an outer surface of the electronic device to absorb heat from the electronic device. The heat absorbed by the heat sink is then dissipated to ambient air.

In order to keep the heat sink in intimate contact with the electronic device, a fastener extends through the heat sink and a printed circuit board where the electronic device is located to fasten the heat sink to the electronic device. However, before the heat sink mounted on the electronic device, the fastener is usually pre-assembled on the heat sink by an annular collar which snaps with an end of the fastener extending beyond the heat sink, for facilitating transportation. However, the collar is prone to disengage from the fastener when subjected to an outer force during transportation, resulting in falling of the fastener from the heat sink.

What is needed, therefore, is a heat dissipation device with a fastener which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
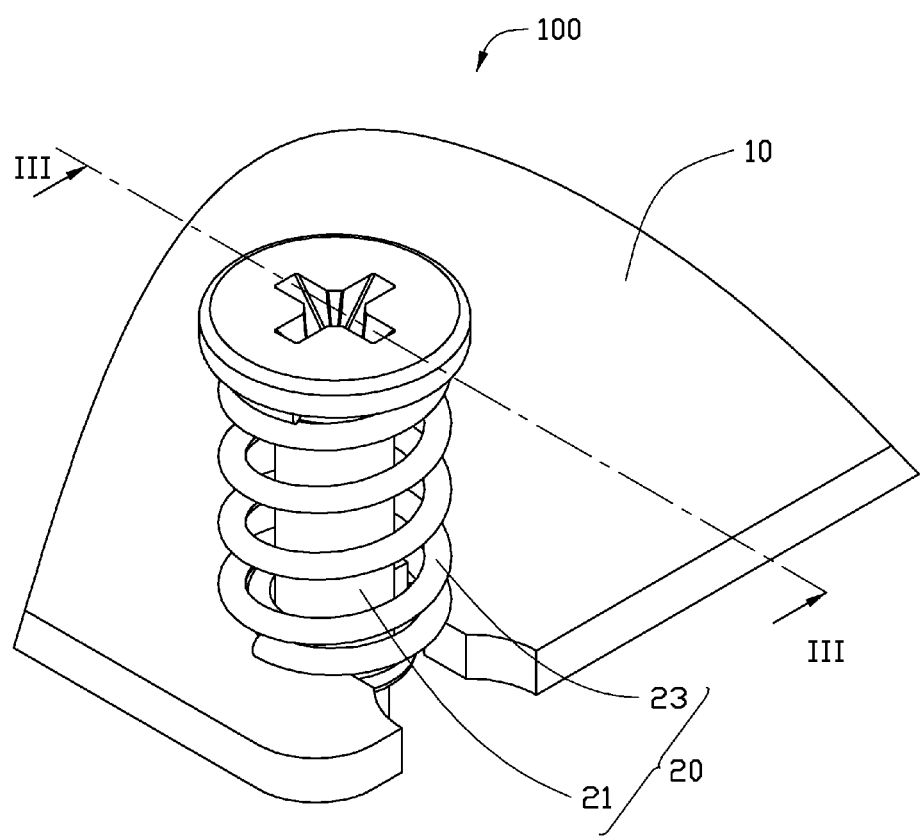
FIG. 1 is an isometric, assembled view of a heat dissipation device in accordance with a first embodiment of the disclosure.
Figure 2:
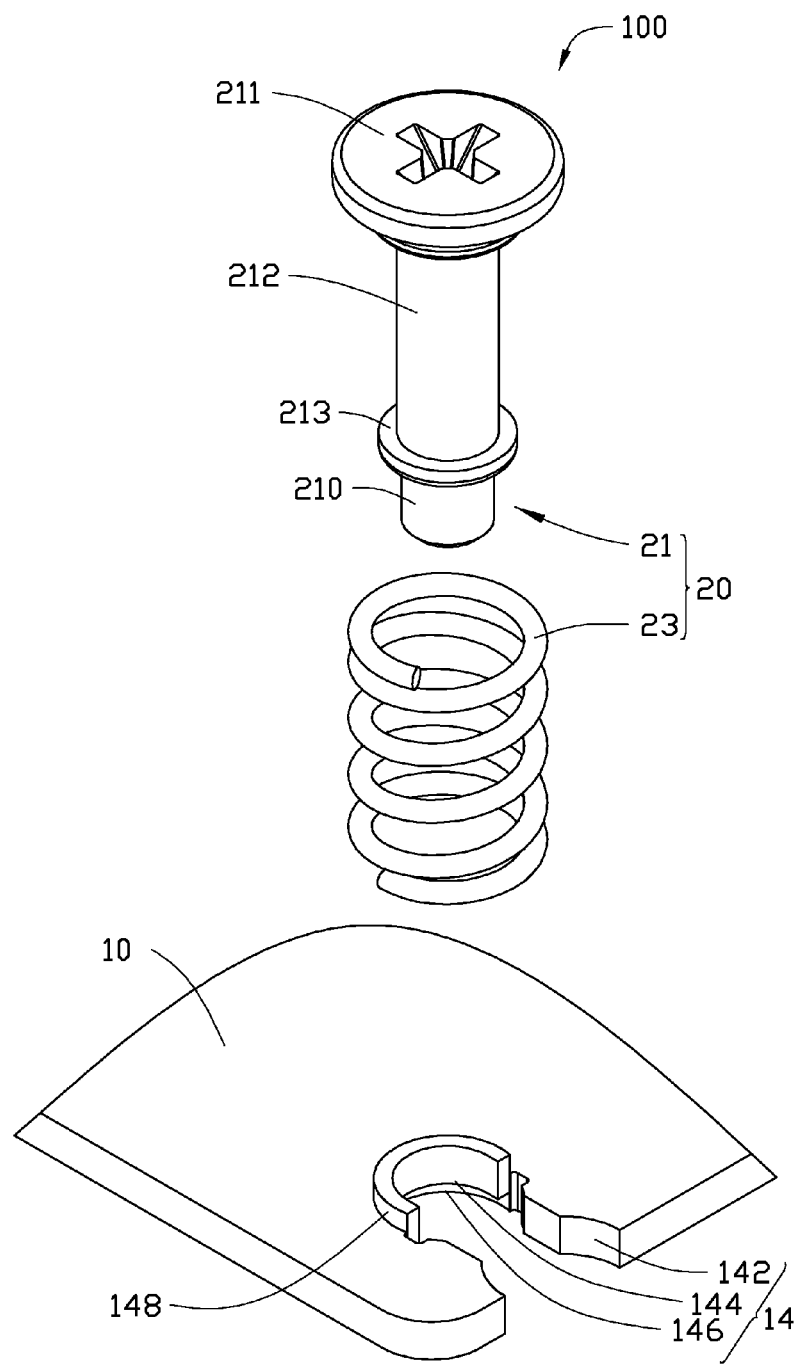
FIG. 2 is an exploded view of the heat dissipation device of FIG. 1.
Figure 3:
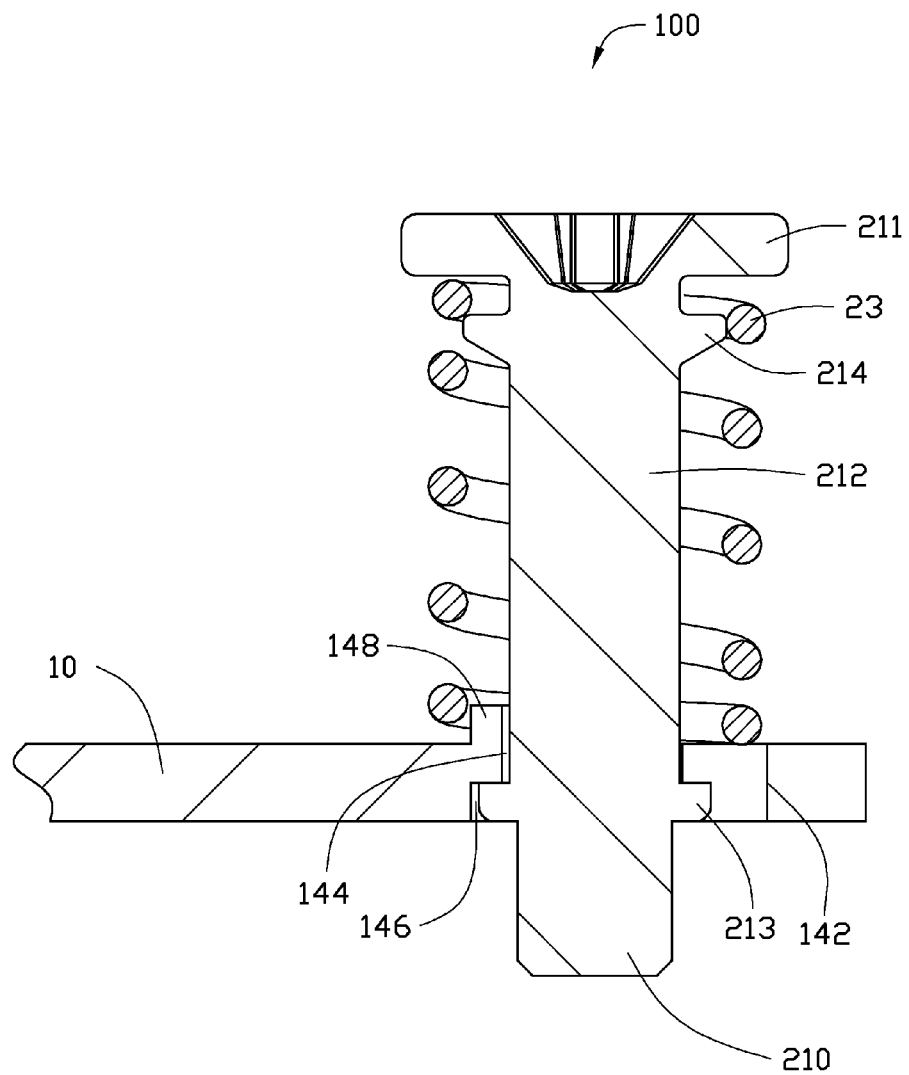
FIG. 3 is a cross-sectional view of the heat dissipation device of FIG. 1, taken along line III-III thereof.

Referring to FIGS. 1-3, a heat dissipation device 100 in accordance with a first embodiment of the disclosure is shown. The heat dissipation device 100 is for dissipating heat generated by an electronic device (not shown) mounted on a printed circuit board (not shown). The heat dissipation device 100 includes a conductive plate 10, and a fastener 20 for fastening the heat dissipation device 100 on the printed circuit board.

The conductive plate 10 defines a supporting portion 14 through the conductive plate 10. The supporting portion 14 includes a hole 142, an upper groove 144, and a lower groove 146 communicating with the hole 142 and the upper groove 144. The hole 142 extends through the conductive plate 10 and communicates with an outer edge of the conductive plate 10. The upper groove 144 is located above and coaxial with the lower groove 146. Each of the hole 142 and the lower groove 146 has a diameter larger than that of the upper groove 144. A semi-annular projection 148 extends upwardly from the top side of the conductive plate 10 at a periphery of the upper groove 144.

The fastener 20 includes a fastening element 21, and an elastic element circling the fastening element 21. In this embodiment, the elastic element is a spring 23. The fastening element 21 comprises a column-shaped pole portion 212, a circular head portion 211 extending from a top end of the pole portion 212, and a column-shaped engaging portion 210 extending from an opposite bottom end of the pole portion 212.

The pole portion 212 has a diameter smaller than that of the upper groove 144. The head portion 211 has a diameter larger than an inner diameter of the spring 23. A flange 213 protrudes horizontally and outwardly from a periphery of the pole portion 212 adjacent to the engaging portion 210. The flange 213 has a diameter smaller than an inner diameter of the spring 23 and a diameter of each of the hole 142 and the lower groove 146 but larger than a diameter of the upper groove 144 of the supporting portion 14. The spring 23 has an outer diameter larger than the diameter of the hole 142. A limiting portion 214 protrudes from the circumference of the pole portion 212 adjacent to the head portion 211. The limiting portion 214 has a diameter smaller than the inner diameter of the spring 23. The projection 148 has a diameter smaller than the inner diameter of the spring 23.

In assembly, the flange 213 extends through the spring 23, so that the spring 23 is sleeved on the pole portion 212 of the fastening element 21. The flange 213 of the fastening element 21 then extends down through the hole 142 from a top side of the conductive plate 10, so that the spring 23 and the flange 213 are respectively located at top and bottom sides of the conductive plate 10. The spring 23 elastically abuts the top side of the conductive plate 10 at a periphery of the hole 142. The fastening element 21 is then moved horizontally to enter the upper groove 144, until the flange 213 abuts the bottom side of the conductive plate 10 at a periphery of the upper groove 144 and is received in the lower groove 146. The spring 213 is clasped by the projection 148 and elastically abuts against the top side of the conductive plate 10 at the periphery of the upper groove 144. Thus, the fastener 20 is securely fastened on the conductive plate 10.

Figure 4:
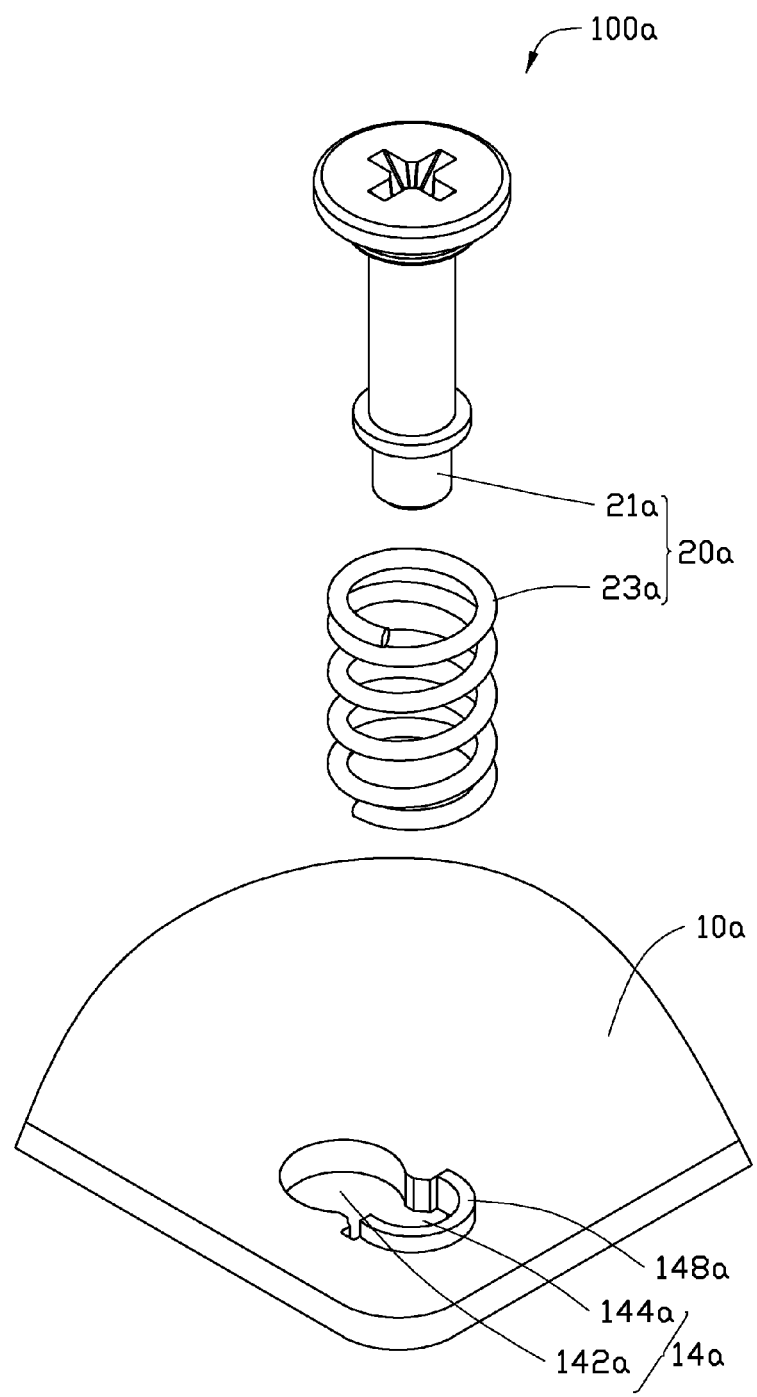
FIG. 4 is an isometric, exploded view of a heat dissipation device in accordance with a second embodiment of the disclosure.
Figure 5:
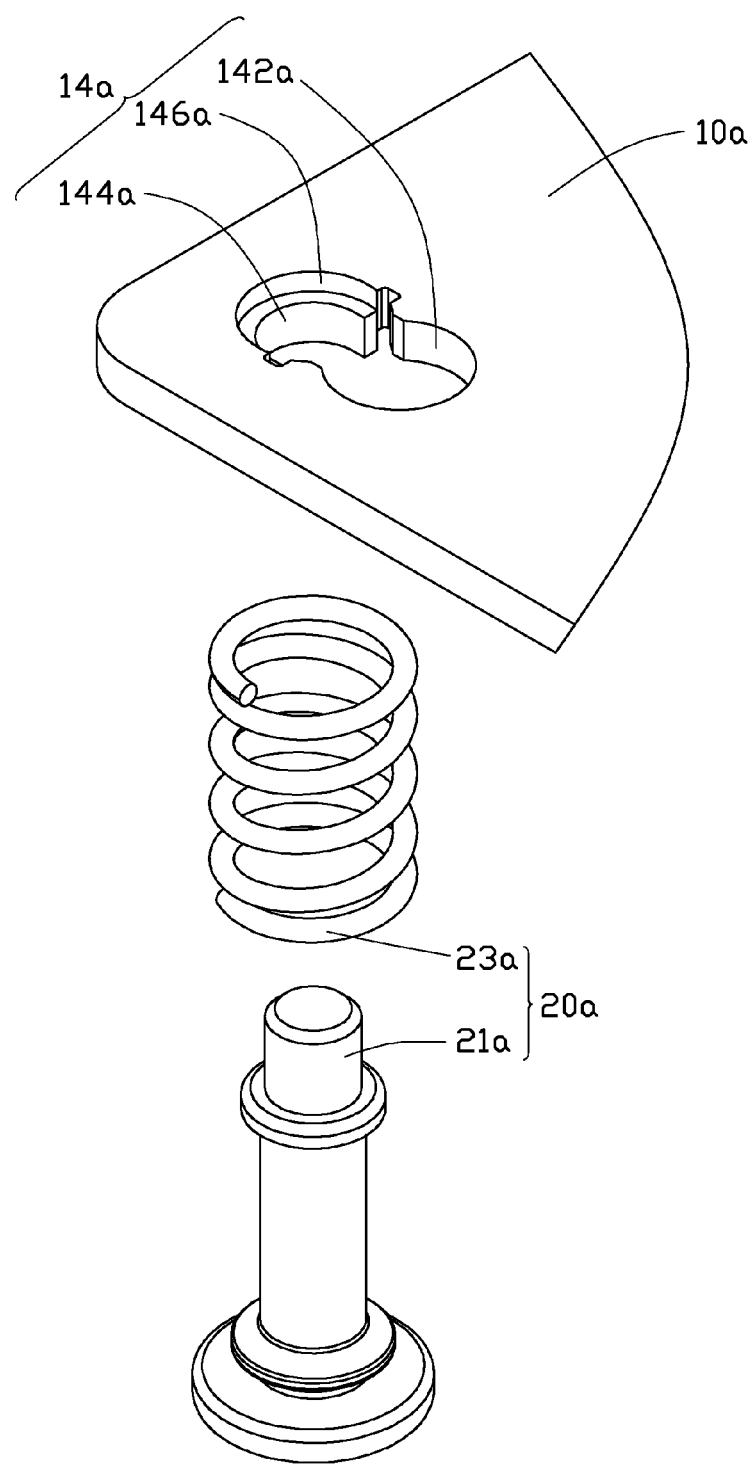
FIG. 5 is an inverted view of the heat dissipation device of FIG. 4.

Referring to FIGS. 4-5, a heat dissipation device 100a in accordance with a second embodiment of the disclosure is shown. The heat dissipation device 100a includes a conductive plate 10a and a fastener 20a. The conductive plate 10a defines a supporting portion 14a through the conductive plate 10a. The supporting portion 14a includes a hole 142a, an upper groove 144a, and a lower groove 146a communicating with the hole 142a and the upper groove 144a. The upper groove 144a is located above and coaxial with the lower groove 146a. The hole 142a extends through the conductive plate 10a. A semi-annular projection 148a extends upwardly from a top side of the conductive plate 10a at a periphery of the upper groove 144a. The fastener 20a includes a fastening element 21a, and an elastic element 23a circling the fastening element 21a. The differences from the first embodiment are in that: the hole 142a of the second embodiment is spaced from any outer edge of the conductive plate 10a.

Figure 6:
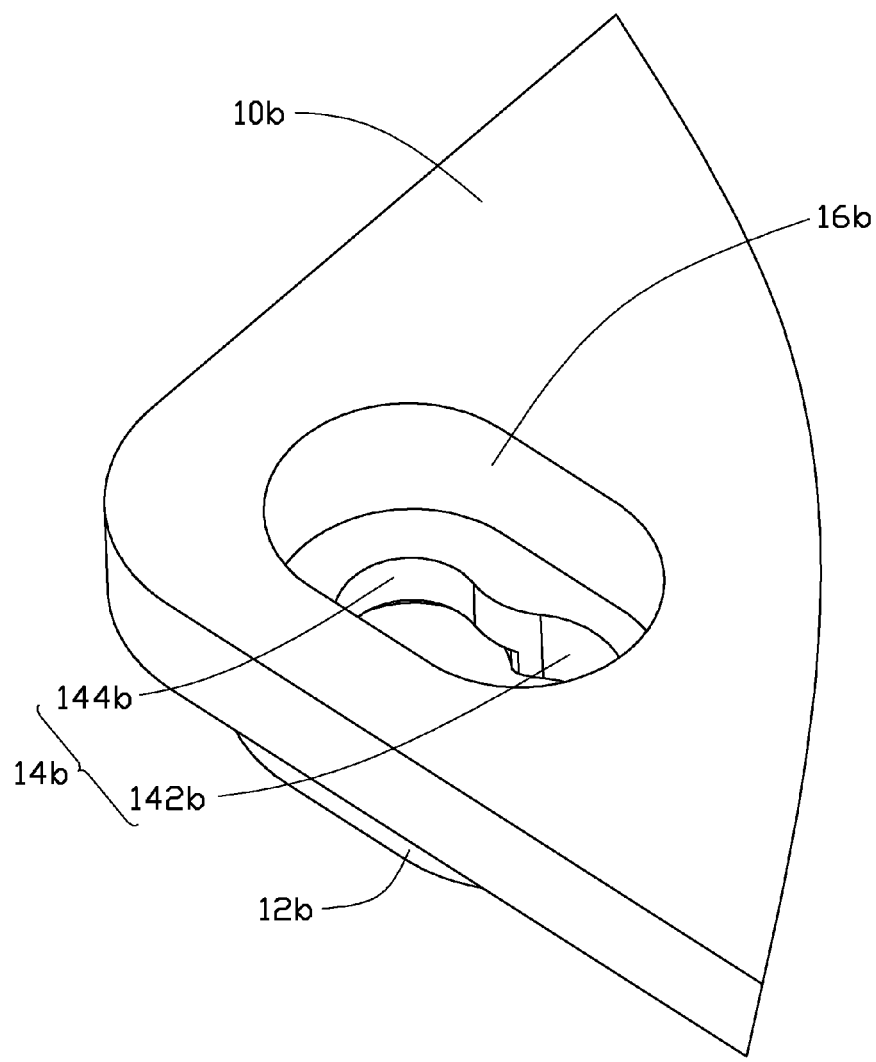
FIG. 6 is a schematic view of a conductive plate of a heat dissipation device in accordance with a third embodiment of the disclosure.
Figure 7:
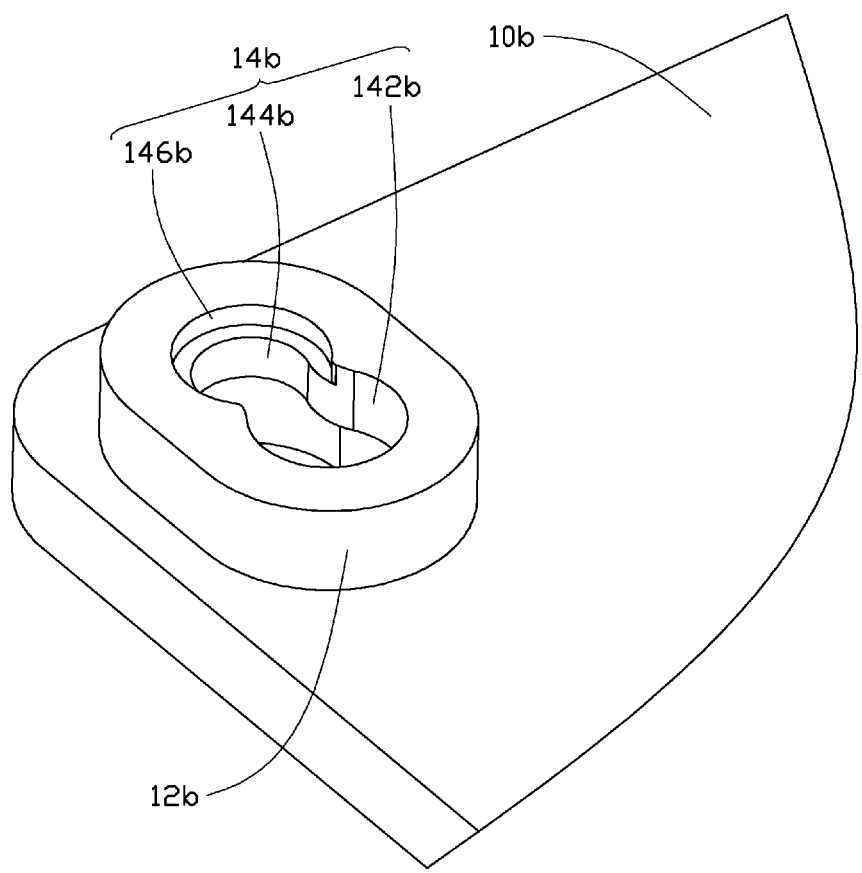
FIG. 7 is an inverted view of the conductive plate of FIG. 6.

Referring to FIGS. 6-7, a conductive plate 10b of a heat dissipation device in accordance with a third embodiment of the disclosure is shown. The conductive plate 10b defines a supporting portion 14b through the conductive plate 10b. The supporting portion 14b includes a hole 142b, an upper groove 144b, and a lower groove 146b communicating with the hole 142b and the upper groove 144b. The lower groove 146b is located below and coaxial with the upper groove 144b. The differences from the second embodiment are in that: a protrusion 12b of the third embodiment protrudes from a bottom of the conductive plate 10b corresponding to the supporting portion 14b, a concave portion 16b is defined in a top of the conductive plate 10b corresponding to the protrusion 12b, the hole 142b extends through the protrusion 12b.

Figure 8:
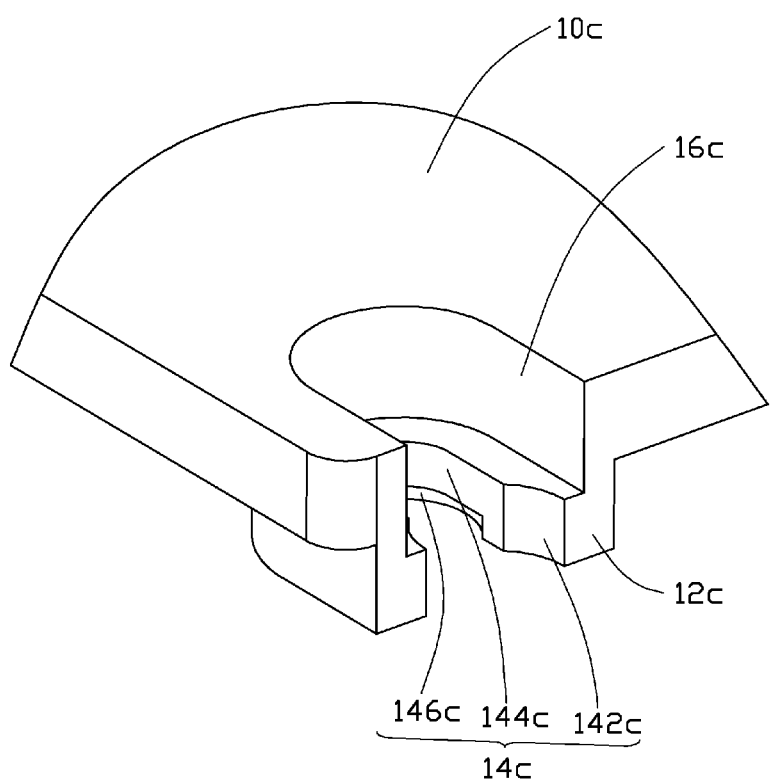
FIG. 8 is a schematic view of a conductive plate of a heat dissipation device in accordance with a fourth embodiment of the disclosure.
Figure 9:
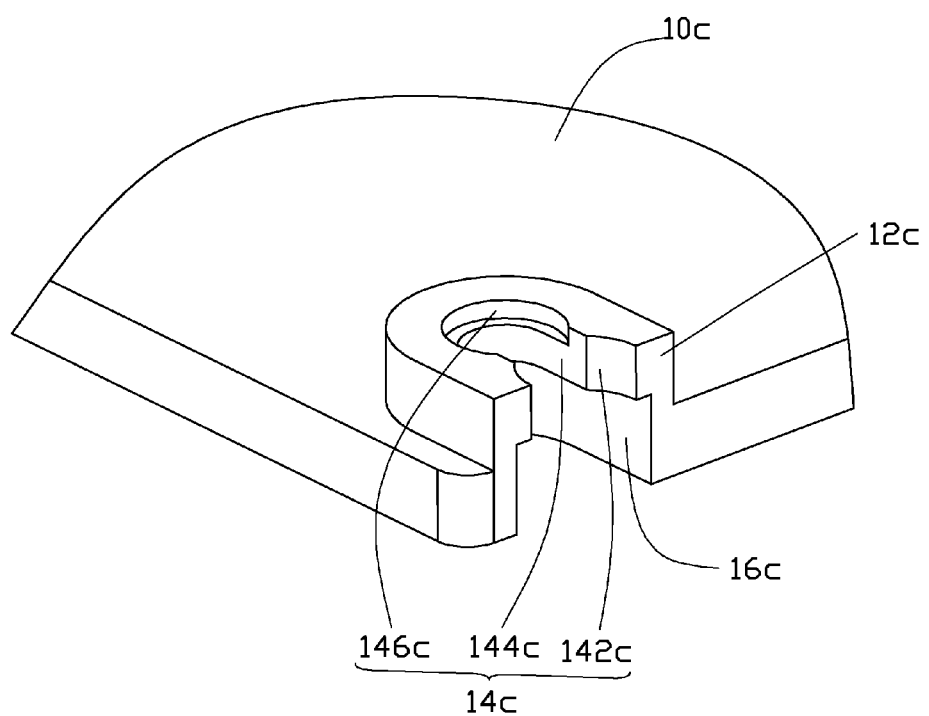
FIG. 9 is an inverted view of the conductive plate of FIG. 8.

Referring to FIGS. 8-9, a conductive plate 10c of a heat dissipation device in accordance with a fourth embodiment of the disclosure is shown. The conductive plate 10c defines a supporting portion 14c through the conductive plate 10c. The supporting portion 14c includes a hole 142c, an upper groove 144c, and a lower groove 146c communicating with the hole 142c and the upper groove 144c. The lower groove 146c is located below and coaxial with the upper groove 144c. The differences from the first embodiment are in that: a protrusion 12c of the fourth embodiment protrudes from a bottom of the conductive plate 10c corresponding to the supporting portion 14c, a concave portion 16c is defined in a top of the conductive plate 10c corresponding to the protrusion 12c, the hole 142c extends through the protrusion 12c.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
a conductive plate defining a supporting portion through the conductive plate, the supporting portion defining a hole, an upper groove and a lower groove communicating with one another, the upper groove being located above and coaxial with the lower groove; and
a fastener comprising a fastening element and an elastic element around the fastening element, the fastening element comprising a pole portion, a head portion formed at one end of the pole portion, an engaging portion formed at another opposite end of the pole portion, and a flange protruding from an outer periphery of the pole portion between the engaging portion and the head portion, the flange having a diameter smaller than a diameter of each of the hole and the lower groove, and larger than a diameter of the upper groove of the supporting portion, the pole portion having a diameter smaller than that of the upper groove, the flange extending through the hole from a top side of the conductive plate, whereby the elastic element and the flange are respectively located at top and bottom sides of the conductive plate, the fastening element being then moved horizontally towards the upper groove, whereby the pole portion enters the upper groove, the flange abuts the bottom side of the conductive plate at a periphery of the upper groove and being received in the lower groove, the elastic element elastically abuts against the top side of the conductive plate at the periphery of the upper groove;
wherein a projection extends upwardly from the top side of the conductive plate at the periphery of the upper groove, the projection having a diameter smaller than an inner diameter of the elastic element, the elastic element configured to be sleeved on the projection.

2. The heat dissipation device of claim 1, wherein the hole extends through the conductive plate and communicates with an outer edge of the conductive plate.

3. The heat dissipation device of claim 2, wherein a protrusion protrudes downwardly from the bottom side of the conductive plate corresponding to the supporting portion, a concave portion being defined in the top side of the conductive plate corresponding to the protrusion, the hole extending through the protrusion.

4. The heat dissipation device of claim 1, wherein the hole extends through the conductive plate and is spaced from an outer edge of the conductive plate.

5. The heat dissipation device of claim 4, wherein a protrusion protrudes from the bottom side of the conductive plate corresponding to the supporting portion, a concave portion being defined in the top side of the conductive plate corresponding to the protrusion, the hole extending through the protrusion.

6. The heat dissipation device of claim 1, wherein the elastic element has an inner diameter larger than the diameter of the flange, the flange extending through the elastic element, the elastic element being sleeved on the pole portion of the fastening element.

7. The heat dissipation device of claim 1, wherein a limiting portion protrudes from the circumference of the pole portion adjacent to the head portion, and the limiting portion has a diameter smaller than an inner diameter of the elastic element.

8. The heat dissipation device of claim 1, wherein the head portion has a diameter larger than an inner diameter of the elastic element, the elastic element being compressed between the head portion and the conductive plate.

9. A heat dissipation device, comprising:
a conductive plate defining a supporting portion through the conductive plate, the supporting portion defining a hole, an upper groove and a lower groove communicating with one another, the upper groove being located above and coaxial with the lower groove; and
a fastener comprising a fastening element and a elastic element around the fastening element, the fastening element comprising a pole portion, a head portion formed at one end of the pole portion, and a flange protruding from an outer periphery of the pole portion, the elastic element having an outer diameter larger than a diameter of the hole, the flange having a diameter smaller than a diameter of the hole and the lower groove but larger than a diameter of the upper groove of the supporting portion, the pole portion having a diameter smaller than that of the upper groove, the flange extending through the hole from a top side of the conductive plate, wherein in assembly, the flange abuts the bottom side of the conductive plate at a periphery of the upper groove and being received in the lower groove, the elastic element elastically abuts against the top side of the conductive plate at the periphery of the upper groove;
wherein a projection extends upwardly from the top side of the conductive plate at the periphery of the upper groove, the projection having a diameter smaller than an inner diameter of the elastic element, the elastic element configured to be sleeved on the projection.

10. The heat dissipation device of claim 9, wherein the hole extends through the conductive plate and communicates with an outer edge of the conductive plate.

11. The heat dissipation device of claim 10, wherein a protrusion protrudes from the bottom side of the conductive plate corresponding to the supporting portion, a concave portion being defined in the top side of the conductive plate corresponding to the protrusion, the hole extending through the protrusion.

12. The heat dissipation device of claim 9, wherein the hole extends through the conductive plate and is spaced from an outer edge of the conductive plate.

13. The heat dissipation device of claim 12, wherein a protrusion protrudes from the bottom side of the conductive plate corresponding to the supporting portion, a concave portion being defined in the top side of the conductive plate corresponding to the protrusion, the hole extending through the protrusion.

14. The heat dissipation device of claim 9, wherein an inner diameter of the elastic element is larger than the diameter of the flange, the flange extending through the elastic element, the elastic element being sleeved on the pole portion of the fastening element.

15. The heat dissipation device of claim 9, wherein a limiting portion protrudes from the outer periphery of the pole portion adjacent to the head portion, and the limiting portion has a diameter smaller than an inner diameter of the elastic element.

16. The heat dissipation device of claim 9, wherein the head portion has a diameter larger than an inner diameter of the elastic element, the elastic element being compressed between the head portion and the conductive plate.

* * * * *